United States Patent
Chan et al.

[11] Patent Number: 6,025,240
[45] Date of Patent: Feb. 15, 2000

[54] METHOD AND SYSTEM FOR USING A SPACER TO OFFSET IMPLANT DAMAGE AND REDUCE LATERAL DIFFUSION IN FLASH MEMORY DEVICES

[75] Inventors: Vei-Han Chan, San Jose; Scott D. Luning, San Francisco; Mark Randolph; Nicholas H. Tripsas, both of San Jose; Daniel Sobek, Portola Valley; Janet Wang, San Francisco; Timothy J. Thurgate, Sunnyvale; Sameer Haddad, San Jose, all of Calif.

[73] Assignee: Advanced Micro Devices, Inc., Sunnyvale, Calif.

[21] Appl. No.: 08/993,600

[22] Filed: Dec. 18, 1997

[51] Int. Cl.[7] .................................................. H01L 21/8247
[52] U.S. Cl. ......................... 438/303; 438/257; 438/265; 438/301
[58] Field of Search .................................... 438/299, 301, 438/303, 257, 265

[56] References Cited

U.S. PATENT DOCUMENTS

| | | | |
|---|---|---|---|
| 4,098,618 | 7/1978 | Crowder et al. | 148/1.5 |
| 4,789,883 | 12/1988 | Cox et al. | 357/23.7 |
| 4,912,062 | 3/1990 | Verma | 437/69 |
| 5,077,230 | 12/1991 | Woo et al. | 437/43 |
| 5,237,188 | 8/1993 | Iwai et al. | 257/325 |
| 5,298,447 | 3/1994 | Hong | 437/43 |
| 5,358,894 | 10/1994 | Fazan et al. | 437/70 |
| 5,360,751 | 11/1994 | Lee | 438/35 |
| 5,470,773 | 11/1995 | Liu et al. | 438/263 |
| 5,550,070 | 8/1996 | Funai et al. | 437/41 |
| 5,552,331 | 9/1996 | Hsu et al. | 438/258 |
| 5,591,652 | 1/1997 | Matsushita | 438/259 |
| 5,592,415 | 1/1997 | Kato et al. | 365/185.01 |
| 5,599,731 | 2/1997 | Park | 437/70 |
| 5,619,051 | 4/1997 | Endo | 257/316 |
| 5,631,179 | 5/1997 | Sung et al. | 438/264 |
| 5,648,287 | 7/1997 | Tsai et al. | 437/44 |
| 5,677,867 | 10/1997 | Hazani | 365/185 |
| 5,680,345 | 10/1997 | Hsu et al. | 365/185.01 |
| 5,714,413 | 2/1998 | Brigham et al. | 438/301 |
| 5,726,070 | 3/1998 | Hong et al. | 437/43 |
| 5,759,900 | 6/1998 | Suh | 438/305 |
| 5,789,295 | 8/1998 | Liu | 438/264 |
| 5,933,730 | 8/1999 | Sun et al. | 438/258 |

*Primary Examiner*—Carl Whitehead, Jr.
*Assistant Examiner*—Maria Guerrero
*Attorney, Agent, or Firm*—Sawyer & Associates

[57] ABSTRACT

A system and method for providing a memory cell on a semiconductor is disclosed. In one aspect, the method and system include providing at least one gate stack on the semiconductor, depositing at least one spacer, and providing at least one source implant in the semiconductor. The at least one gate stack has an edge. A portion of the at least one spacer is disposed along the edge of the at least one gate stack. In another aspect, the method and system include providing at least one gate stack on the semiconductor, providing a first junction implant in the semiconductor, depositing at least one spacer, and providing a second junction implant in the semiconductor after the at least one spacer is deposited. The at least one gate stack has an edge. A portion of the at least one spacer is disposed at the edge of the at least one gate stack. In a third aspect, the method and system include providing at least one gate stack on the semiconductor, providing at least one source implant in the semiconductor, depositing at least one spacer after the at least one source implant is provided, and providing at least one drain implant in the semiconductor after the spacer is deposited. The at least one gate has an edge. A portion of the at least one spacer is disposed along the edge of the at least one gate.

25 Claims, 4 Drawing Sheets

METHOD AND SYSTEM FOR USING A SPACER TO OFFSET IMPLANT DAMAGE AND REDUCE LATERAL DIFFUSION IN FLASH MEMORY DEVICES

FIELD OF THE INVENTION

The present invention relates to flash memory cells and more particularly to a method and system for using a spacer to reduce implant damage and lateral diffusion in the memory cell.

BACKGROUND OF THE INVENTION

A conventional flash memory cell includes a gate stack, a source, a drain, and a channel disposed between the source and the drain. To form a conventional memory cell, a tunnel oxide is grown on a semiconductor substrate. Typically, the gate stack is then formed on the tunnel oxide. The gate stack is then exposed to an oxidizing agent at a high temperature to grow a layer of oxide on the gate stack. Once the growth of the oxide layer is completed, the source and drain are implanted. In conventional flash memories including logic devices, once processing of the memory cells is completed, the logic device at the periphery is typically formed. For logic devices including a spacer, formation of the logic devices includes providing the spacer. The spacer in a logic device acts to space apart features of the logic device from the gate of the logic device.

The oxide layer is grown on the gate stack of the conventional memory cell for several purposes. One purpose of the oxide layer is to provide a spacer which serves to spatially separate the effects of a subsequent processing step from the edge of the gate stack. For example, the spacer separates the source and drain implants from the gate stack. This spacer helps reduce implant induced damage in the semiconductor near the gate stack. Thus, leakage of charge carriers between the floating gate and the source or drain due to damage in the semiconductor is reduced. In addition, growth of the oxide layer rounds the corner of the floating gate. This reduces electric fields which would otherwise be highly concentrated at the corner.

Although oxidizing the gate stack provides the spacer and rounds the corner of the floating gate, the oxidation step also lifts the edges of the floating gate. As the oxide grows on the gate stack, the oxide on the surface of the silicon continues to grow. Some oxide grows under the edges of the floating gate, lifting the edges of the floating gate.

Gate edge lifting is undesirable for many reasons. For example, gate edge lifting adversely affects erase and placement of the source. In order to erase the conventional memory cell, charge carriers tunnel from the floating gate to the source. Tunneling of charge carriers depends in part on the thickness of tunnel oxide through which the charge carriers must tunnel. To increase tunneling and raise erase efficiency, the tunnel oxide between the source and drain should be thin. Because of gate edge lifting, the source is typically driven farther under the gate to reach a thinner portion of the tunnel oxide. Driving the source farther under the gate makes the channel smaller. As a result, short channel effects, which degrade the performance of the memory cell, increase.

Accordingly, what is needed is a system and method for providing a memory cell having reduced implant induced damage near the source or drain and with reduced gate edge lifting. The present invention addresses such a need.

SUMMARY OF THE INVENTION

The present invention provides a method and system for providing a memory cell on a semiconductor. In one aspect, the method and system comprise providing at least one gate stack on the semiconductor, depositing at least one spacer, and providing at least one source implant. The gate stack has an edge. A portion of the at least one spacer is disposed along the edge of the at least one gate stack. In another aspect, the method and system comprise providing at least one gate stack on a semiconductor, providing a first junction implant in the semiconductor, depositing at least one spacer, and providing a second junction implant in the semiconductor after the at least one spacer is deposited. The gate stack has an edge. A portion of the at least one spacer is disposed at the edge of the at least one gate stack. In a third aspect, the method and system comprise providing at least one gate stack on a semiconductor, providing at least one source implant in the semiconductor, depositing at least one spacer after the at least one source implant is provided, and providing at least one drain implant in the semiconductor after the spacer is deposited. The at least one gate has an edge. A portion of the at least one spacer is disposed along the edge of the at least one gate.

According to the system and method disclosed herein, the present invention provides a memory cell having reduced short channel effects, thereby increasing overall system performance.

DETAILED DESCRIPTION OF THE INVENTION

The present invention relates to an improvement in semiconductor processing. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown but is to be accorded the widest scope consistent with the principles and features described herein.

Figure 1:
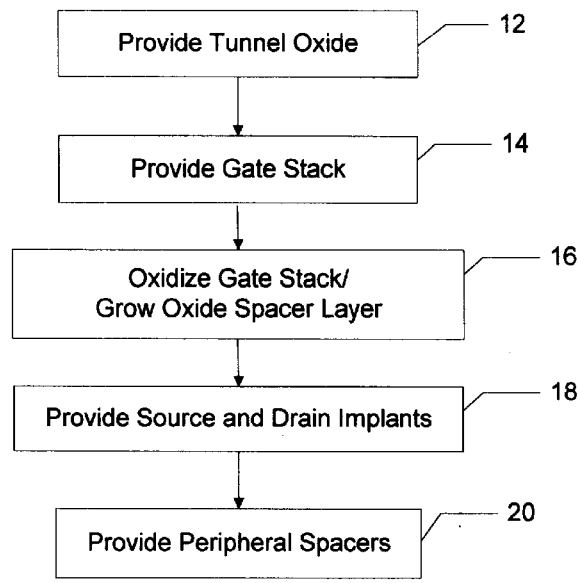
FIG. 1 is a flow chart of a method for forming a conventional flash memory cell.

FIG. 1 is a flow chart of a conventional method 10 for providing a flash memory cell. Only certain steps in the process are depicted in the method 10 of FIG. 1. A tunnel oxide is grown or deposited on a semiconductor substrate via step 12. A gate stack is then provided via step 14. Typically, the gate stack includes a floating gate and a control gate. The gate stack is then oxidized via step 16 to grow an oxide layer. Source and drain implants are then provided via step 18. The source implant typically includes a phosphorus implant and an arsenic implant. Typically, the dopants for the source and drain are also treated to diffuse the dopants through the semiconductor and electrically activate the dopants. Finally, if the flash memory includes logic devices at the periphery, any spacers for these logic devices are provided via step 20.

Figure 2:
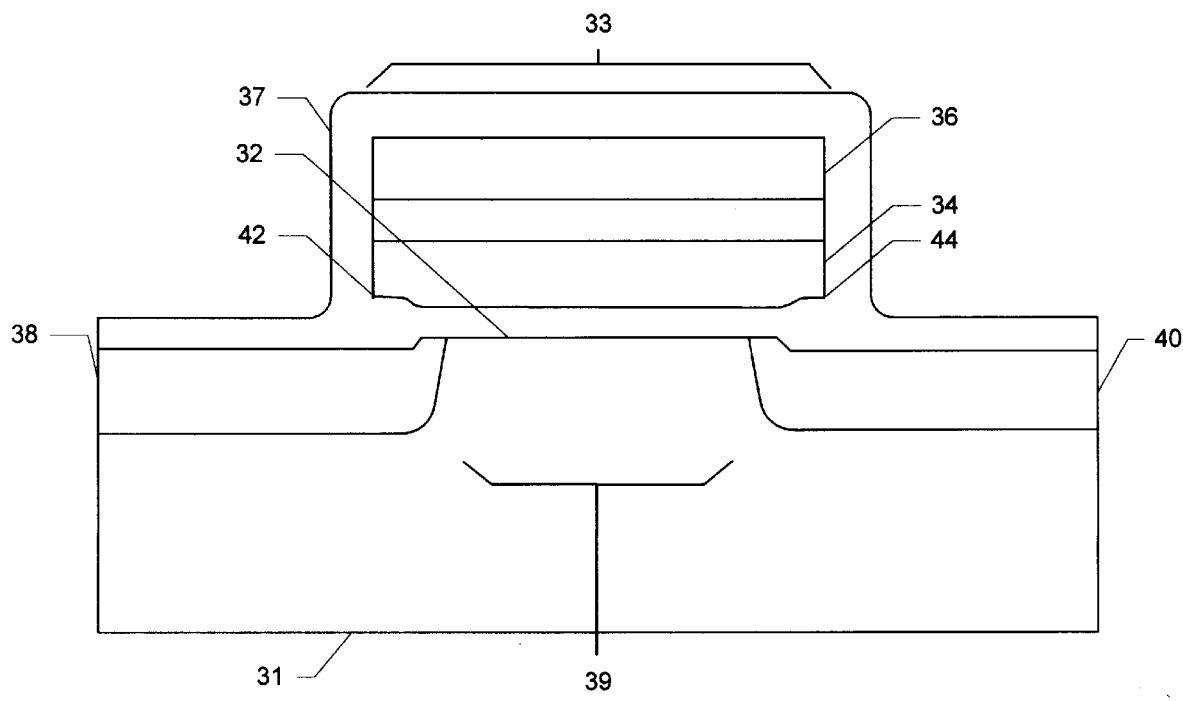
FIG. 2 is a schematic depicting a conventional flash memory cell.

FIG. 2 depicts a conventional flash memory cell 30 formed on a semiconductor 31 using the method 10. The conventional memory cell 30 includes a tunnel oxide 32, a gate stack 33 having at least a floating gate 34 and a control gate 36. Typically, the floating gate 34 and the control gate 36 are separated by an insulating layer. The conventional memory cell 30 also includes an oxide layer 37 grown during the oxidation step 16, a source 38, and a drain 40. A channel 39 is disposed between the source 38 and the drain 40.

The oxide layer 37 grown for the memory cell 30 has several functions. First, the oxide layer 37 spaces the source 38 and drain 40 implants farther from the gate. Thus, reference is made to this portion of the oxide layer 37 along the edge of the gate stack 33 as a spacer. In addition, although depicted as a two-dimensional edge in FIG. 2, the edge of the gate stack 33 is a three-dimensional vertical face. Consequently, in the context of this application, an edge is a three-dimensional vertical face of a gate stack. The source 38 and drain 40 implants create damage in the semiconductor 31. For example, as the dopants for the source 38 and drain 40 pass through the semiconductor, the dopants may knock semiconductor atoms off of lattice sites, creating a defect. If the damage created by the source 38 and drain 40 implants is too close to the floating gate 34, the damage could adversely affect the performance of the memory cell 30. For example, the damage could create a leakage path for charge carriers between the floating gate 34 and the source 38 or drain 40. The leakage path could result in charge loss. The growth of the oxide layer 37 reduces the damage close to the floating gate 24 by spacing the source 38 and drain 40 implants apart from the floating gate 24 by the thickness of the oxide layer 37 on the sides of the gate stack 33. In addition, growth of the oxide layer 37 rounds corners 42 and 44 of the floating gate 34. Thus, electric fields at the corners 42 and 44 of the floating gate 34 are reduced. Although the corners 42 and 44 are depicted as two-dimensional in FIG. 2, the corner of a gate is a three-dimensional edge. Consequently, in the context of this application, a corner is an edge of a three-dimensional gate.

Although the conventional memory cell 30 shown in FIG. 2 functions, those with ordinary skill in the art will realize that growth of the oxide layer 37 causes gate edge lifting. The oxide layer 37 grows on the gate stack 33 and semiconductor 31 because an oxidizing species forms the oxide at the edges of the gate stack 33. The oxidizing species also diffuses laterally through an oxide, causing additional oxide to grow in a portion of the space between the floating gate 34 and the semiconductor 31. The growth of additional oxide between the floating gate 34 and the semiconductor 31 causes the edge of the floating gate 34 to lift. This phenomenon is known as gate edge lifting.

Gate edge lifting requires that the source 38 be driven farther under the floating gate 34. An erase in a conventional memory cell is carried out through tunneling of charge carriers between the floating gate 34 and the source 38. This tunneling increases where the source 38 and floating gate 34 are closer. Gate edge lifting increases the distance between the source 38 and the floating gate 34 near the edge of the floating gate 34. To increase tunneling and, therefore, erase efficiency, the source 38 is driven farther under the floating gate 34 than would otherwise be required.

Because the source 38 is driven farther under the floating gate 34, the channel 39 is shortened, increasing undesirable short channel effects. Short channel effects adversely affect the performance of the memory cell 30. For example, short channel effects can cause a leakage of charge carriers between the source 38 and drain 40. To reduce short channel effects, the conventional memory cell 30 must be made larger. Consequently, fewer conventional memory cells 30 can be packed in a given area of the semiconductor 31.

The present invention provides for a method and system for providing a memory cell having reduced damage near the gate stack and reduced gate edge lifting. The method and system comprise providing at least one gate stack having an edge, depositing at least one spacer, and providing at least one source implant. A portion of the at least one spacer is disposed at the edge of the at least one gate stack. Because the at least one spacer is deposited gate edge lifting is reduced.

The present invention will be described in terms of a method and system using particular dopants or other materials. However, one of ordinary skill in the art will readily recognize that this method and system will operate effectively for other types of materials or dopants. Moreover, although the method and system are described in the context of particular steps for providing a single memory cell, nothing prevents providing multiple memory cells or using processes in accordance with the present invention which also have additional steps.

Figure 3A:
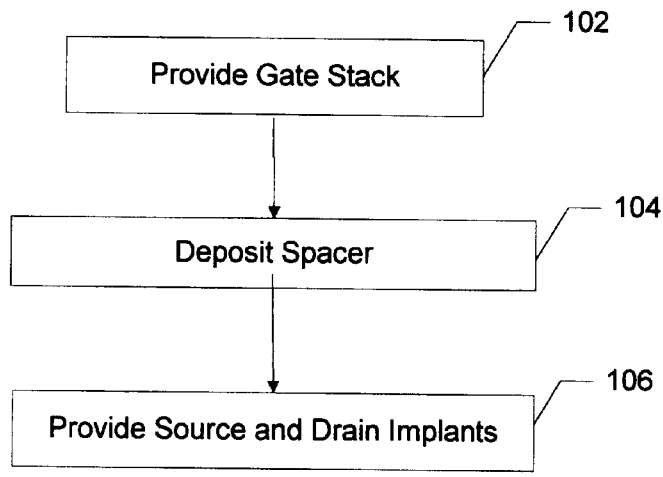
FIG. 3A is a flow chart of a first method for providing a flash memory cell in accordance with the present invention.

To more particularly illustrate the method and system in accordance with the present invention, refer now to FIGS. 3A–3D. FIGS. 3A–3D depict flow charts of alternate methods 100, 120, 130, and 150 in accordance with the present invention. Referring now to FIG. 3A, a first method 100 in accordance with the present invention is shown. After a tunnel oxide is grown, a gate stack is provided via step 102. In a preferred embodiment, the gate stack includes at least floating gate and a control gate. The gate stack providing step 102 generally includes the process of depositing several polysilicon layers, for example for the floating gate and control gate, masking the layers, and etching the layers to form the gate stack.

Once the gate stack has been provided, a spacer is deposited via step 104. In a preferred embodiment, the spacer is composed of either a nitride layer or an oxide layer. However, nothing prevents forming a spacer by depositing another insulating material or by depositing a conductive material that is electrically isolated from the gates in the gate stack and the substrate. In one embodiment, the spacer completely covers the gate stack. In another embodiment, the nitride or oxide layer can be etched to provide isolated spacers at the edges of a gate stack. After the spacer is deposited, the source and drain implants are provided via step 106. In a preferred embodiment, the source implant is a double diffuse implant including phosphorus and arsenic implants.

Figure 3B:
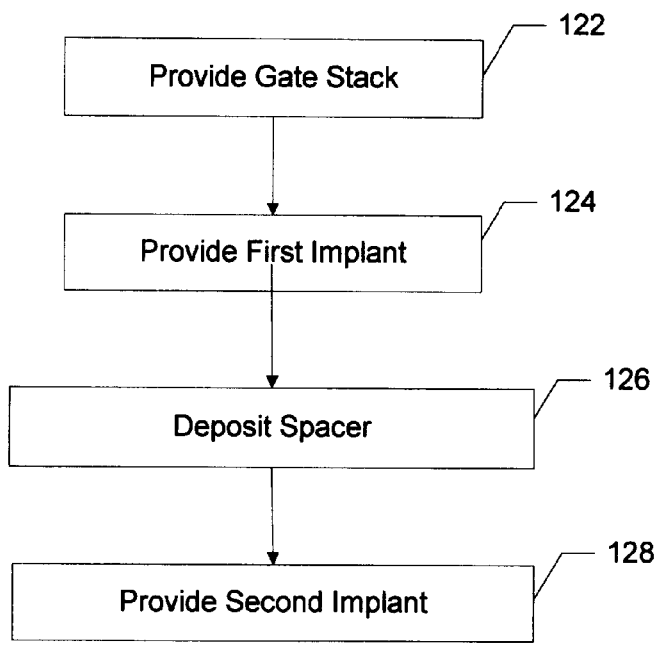
FIG. 3B is a flow chart of a second method for providing a flash memory cell in accordance with the present invention.

Referring now to FIG. 3B, another method 120 of providing a flash memory cell in accordance with the method and system is depicted. After a tunnel oxide is grown, a gate stack is provided via step 122. A first implant is then provided via step 124. In a preferred embodiment, the first implant is a phosphorus implant. A spacer is then deposited via step 126. In a preferred embodiment, the spacer is composed of either a nitride layer or an oxide layer.

However, nothing prevents forming a spacer by depositing another insulating material or by depositing conductive material that is electrically isolated from the gates in the gate stack and the substrate. The spacer layer may either cover the entire gate stack or be etched to provide isolated spacers at the edges of a gate stack. A second implant is then provided via step 128. Preferably the second implant is an arsenic implant.

Figure 3C:
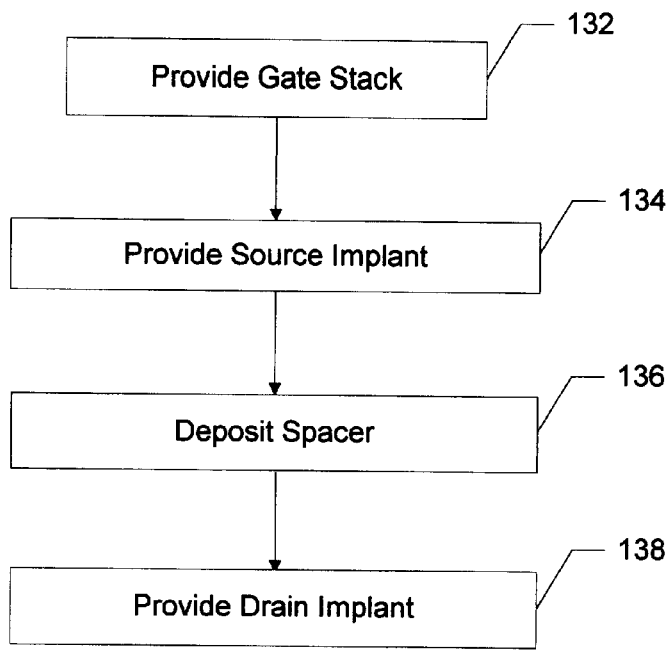
FIG. 3C is a flow chart of a third method for providing a flash memory cell in accordance with the present invention.

Referring now to FIG. 3C, a third method 130 of providing a flash memory cell in accordance with the method and system is depicted. After a tunnel oxide is grown, a gate stack is provided via step 132. A source implant is then provided via step 134. In a preferred embodiment, the implant includes an arsenic implant and a phosphorous implant. A spacer is then deposited via step 136. In a preferred embodiment, the spacer is composed of either a nitride layer or an oxide layer. However, nothing prevents forming a spacer by depositing another insulating material or by depositing conductive material that is electrically isolated from the gates in the gate stack and the substrate. The spacer layer may either cover the entire gate stack or be etched to provide isolated spacers at the edges of a gate stack. A drain is then provided via step 128. In a preferred embodiment, the drain implant includes an arsenic implant.

The method 130 allows the source to be placed closer to the gate stack than the drain. As discussed previously, it is often desirable to have greater overlap of the source with the gate stack. In contrast, little overlap of the drain with the gate stack is required. In addition, a rather large dose of arsenic may be used in the drain implant to improve program speed. A large dose of arsenic induces large lateral diffusion of the drain implant, shortening the channel and increasing short channel effects. Thus, the method 130 allows for greater overlap of the source with the gate stack than the drain and decreased short channel effects.

Figure 3D:
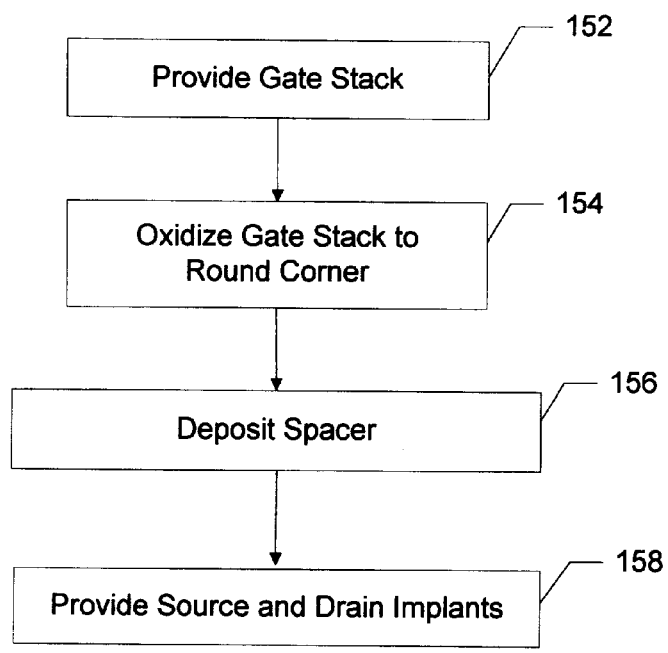
FIG. 3D is a flow chart of an alternate method for providing a flash memory cell in accordance with the present invention.

FIG. 3D depicts a method 150 which adds an oxidizing step to the method 100. After formation of the gate stack via step 152, the gate stack is exposed to an oxidizing agent at high temperature via step 154. The oxidizing step 154 is performed to round a corner of the gate stack. Generally, the amount of oxidation required to round the corner is slight. Consequently, in a preferred embodiment, the oxidizing step 154 is carried out only until the corner is rounded. Thus, little gate edge lifting will occur.

The layer of oxide grown during the oxidizing step 154 which rounds the corner is insufficient to space the source and drain implants a desired distance from the gate stack. Thus, a spacer is then deposited via step 156. The source and drain implants are then provided via step 158. Although the oxidizing step 154 is described as being added to the method 100, the gate stacks in the methods 120 and 130 can also be oxidized to round a corner of the gate stack.

Figure 4A:
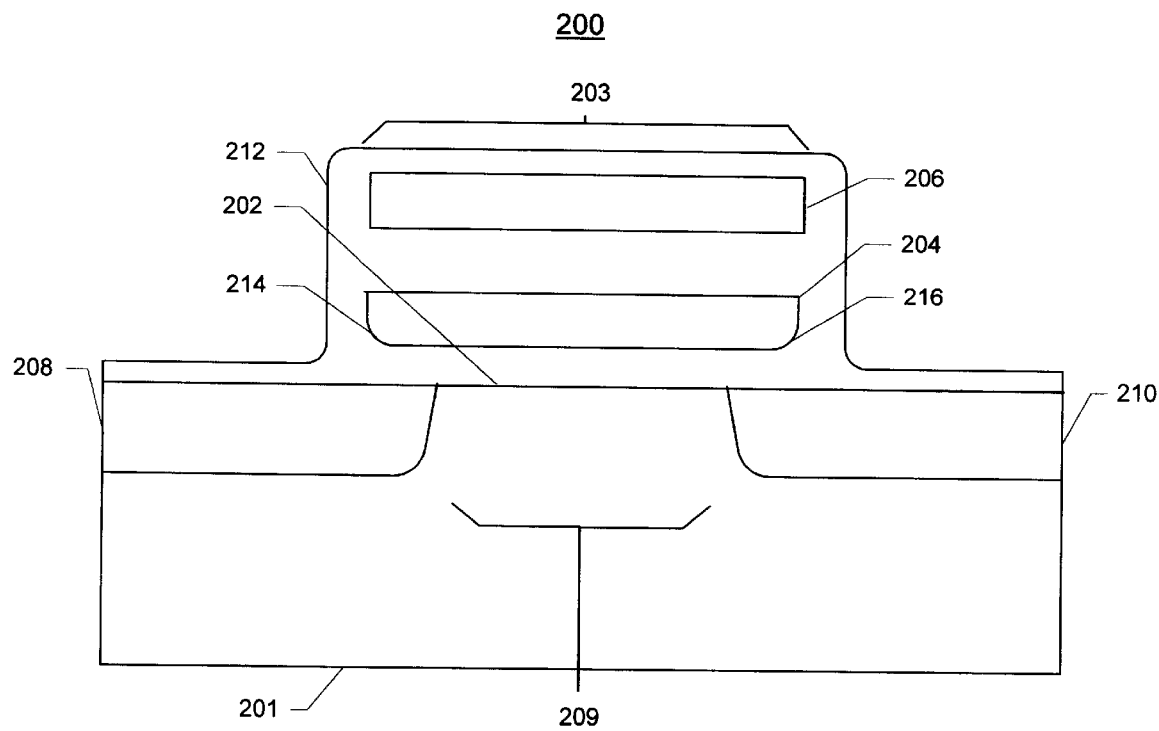
FIG. 4A is a schematic of a flash memory cell in accordance with the method and system.

FIG. 4A depicts flash memory cell 200 formed in accordance with the present invention. The memory cell 200 includes a tunnel oxide 202 grown on a semiconductor 201 and a gate stack 203. The gate stack 203 includes at least a floating gate 204 and a control gate 206. A spacer 212 covers the gate stack 203. In a preferred embodiment, the spacer layer is on the order of one hundred to two hundred Angstroms thick. The spacer 212 lies along an edge of the gate stack 203. As previously discussed, in the context of this application, an edge is a three-dimensional vertical face of a gate stack. The memory cell 200 also includes a source 208, a drain 210, and a channel 209 disposed between the source 208 and the drain 210.

Figure 4B:
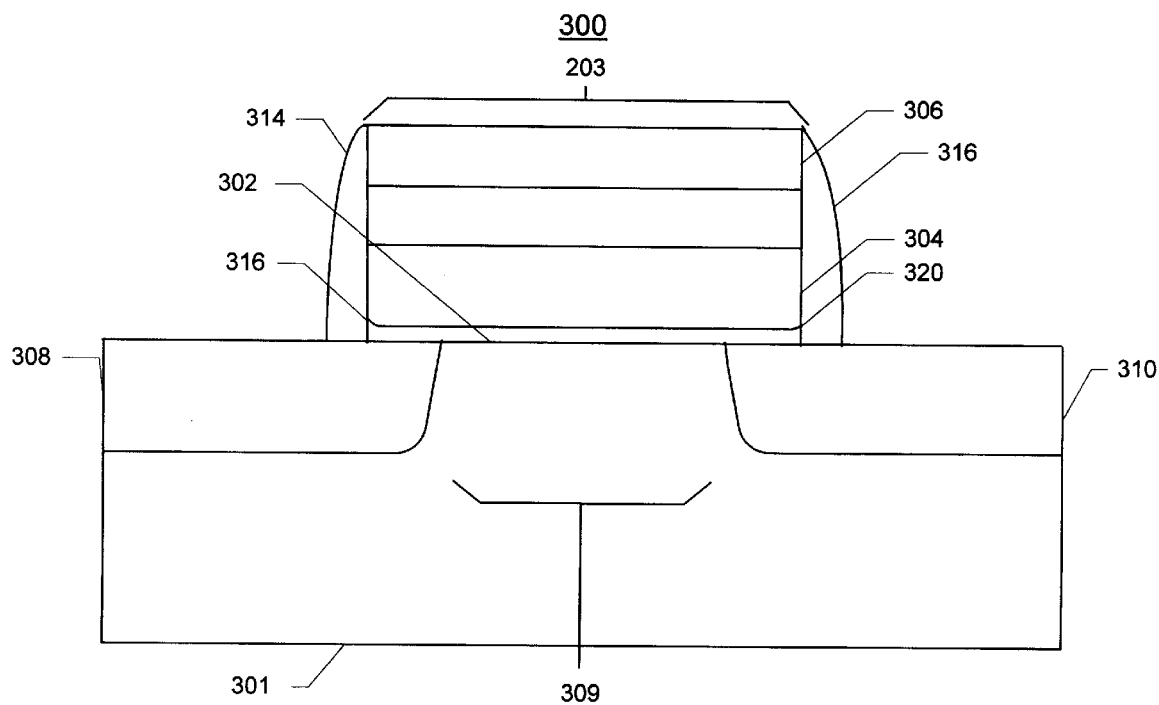
FIG. 4B is a schematic of another flash memory cell in accordance with the method and system.

FIG. 4B depicts flash memory cell 300 formed in accordance with the present invention. The memory cell 300 includes a tunnel oxide 302 grown on a semiconductor 301 and a gate stack 303. The gate stack 303 includes at least a floating gate 304 and a control gate 306. Spacers 314 and 316 are disposed at the sides of the gate stack 303. In a preferred embodiment, the spacers 314 and 316 are on the order of one hundred to two hundred Angstroms thick. The spacers 314 and 316 are formed by etching a spacer layer, such as the spacer 212 shown in FIG. 4A. Referring back to FIG. 4B, the memory cell 300 also includes a source 308, a drain 310, and a channel 309 disposed between the source 308 and the drain 310.

Because the spacers 212, 314, and 316 are deposited rather than grown, gate edge lifting is reduced. Gate edge lifting occurs because of lateral diffusion of an oxidizing agent under the floating gates 204 and 304. When the spacers 212, 314, and 316 are deposited, an oxidizing agent may not be required. The semiconductor and the gate stack material are, therefore, not consumed. Thus, the tunnel oxide 202 or 302 does not increase in thickness near the edge of the floating gate 204 or 304, respectively.

The memory cells 200 and 300 are depicted as having rounded corners 214 and 216, and 316 and 318, respectively. As discussed previously, in the context of this application, the corner is an edge of a three-dimensional gate. Although the gate stack 203 is exposed to an oxidizing agent to round the corners 214 and 216 of the memory cell 200, gate edge lifting is substantially reduced. Similarly, even thought the gate stack 303 is exposed to an oxidizing agent to round the corners 318 and 320 of the memory cell 300, gate edge lifting is substantially reduced. Generally, the corners 214, 216, 318, and 320 round quickly. Thus, the edges of the floating gate 204 or 304 will lift only slightly because only a very thin layer of additional oxide will be grown between the floating gate 204 or 304 and the source 208 or 308, respectively. Similarly, only a very thin layer of oxide will be grown at the sides of the gate stacks 203 and 303. The source 208 and/or drain 210 implants can be further spaced farther from the gate stack 203 by the deposition of the spacer 212. Similarly, the source 308 and/or drain 310 implants can be further spaced farther from the gate stack 303 by the deposition of the spacers 314 and 316, respectively. The additional spacers 212, 314, and 316 do not cause substantial additional gate edge lifting because they are deposited rather than grown.

Because gate edge lifting is reduced, the source 208 or 308 can be placed farther from the drain 210 or 310, respectively for a gate stack 203 or 303, respectively, of a given size. Thus, short channel effects are reduced for a gate stack 203 or 303 of a particular size. Moreover, the memory cells 200 and 300 can be made smaller because less underdiffusion of the source 208 or 308 is required. In addition, in the method 130 where the drain 210 or 310 is implanted separately from the source 208 or 308, respectively, the drain may be placed farther from the source. Thus, smaller memory cells 200 and 300 can be provided. As a result, more memory cells 200 and 300 can be packed on a given area of the semiconductor 201 and 301, respectively.

Deposition of the spacers 212, 314, and 316 reduce damage close to the gate stacks 203 and 303, respectively. Because of the spacers 212, 314, and 316, the source 208 and 308 and/or drain 210 and 310 implants can be offset from the gate stacks 200 and 300, respectively. Thus, the damage caused by the implants for the sources 208 and 308 or the drains 210 and 310 is still farther from the gate stacks 203 and 303, respectively. Thus, damaged induced defects in the behavior of the memory cell 200 or 300 is reduced.

Some flash memories also include logic devices, not shown, which are generally located at the periphery of the flash memory. These logic devices often include logic device spacers, not shown, which are deposited after the formation of memory cells in the interior of the flash memory is complete. The same spacer depositing step 104, 126, 134, or 156 in the methods 100, 120, 130, or 150 can be used to form the logic device spacers. Thus, the logic device spacers can be formed earlier in the processing of the flash memory, when the spacer 212 or spacers 314 and 316 are formed for the memory cells 200 or 300, respectively. Simultaneous formation of the logic device spacers and the spacers 212, or spacers 314 and 316 is particularly useful where the logic device spacers are compatible with the spacers 212, 314 or 316. For example, simultaneous formation of the logic device spacers and the spacer 212 is particularly useful where the logic device spacers and the spacer 212 have the same width. Similarly, simultaneous formation of the logic device spacers and spacers 314 and 316 is particularly useful where the logic device spacers and the spacers 314 and 316 have the same width. Where the logic device spacers and the spacer 212 or the spacers 314 and 316 are formed together, an additional step of providing the logic device spacer is not required.

A method and system has been disclosed for providing a memory cell having reduced gate edge lifting and reduced damage near the gate stack.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A method for providing a memory cell on a semiconductor comprising the steps of:
    (a) providing at least one gate stack on the semiconductor, the at least one gate stack having an edge;
    (b) depositing at least one spacer, a portion of the at least one spacer being disposed along the edge of the at least one gate stack, the at least one spacer having a thickness of less than or equal to two hundred Angstroms; and
    (c) providing at least one source implant in the semiconductor.

2. The method of claim 1 wherein steps (a) through (c) are provided in sequential order.

3. The method of claim 1 wherein the portion of the at least one spacer includes a surface, substantially all of the surface being in contact with the edge of the at least one gate stack.

4. The method of claim 1 wherein the at least one gate stack includes at least one corner, the method further comprising the step of:
    (d) oxidizing the at least one gate stack in order to round the at least one corner.

5. The method of claim 4 wherein the at least one gate stack includes a floating gate having an edge; and
    wherein the edge of the floating gate is not lifted by the at least one spacer depositing step (b).

6. The method of claim 5 wherein at least one spacer depositing step (b) further includes the step of:
    (b1) etching the at least one spacer.

7. The method of claim 6 wherein the at least one source implant step (c) further includes the step of:
    (c1) providing an arsenic implant and a phosphorous implant in the semiconductor.

8. The method of claim 7 further comprising the step of:
    (e) providing at least one drain implant in the semiconductor.

9. A method for providing a memory cell on a semiconductor comprising the steps of:
    (a) providing at least one gate stack on the semiconductor, the at least one gate stack having an edge;
    (b) providing a first junction implant on the semiconductor;
    (c) depositing at least one spacer, a portion of the at least one spacer being disposed along the edge of the at least one gate stack, the at least one spacer having a thickness of less than or equal to two hundred Angstroms; and
    (d) providing a second junction implant in the semiconductor after the at least one spacer is deposited.

10. The method of claim 9 wherein steps (a) through (d) are provided in sequential order.

11. The method of claim 9 wherein the portion of the at least one spacer includes a surface, substantially all of the surface being in contact with the edge of the at least one gate stack.

12. The method of claim 9 wherein the at least one gate stack includes at least one corner, the method further comprising the step of:
    (e) oxidizing the at least one gate stack in order to round the at least one corner.

13. The method of claim 12 wherein the at least one gate stack includes a floating gate having an edge; and
    wherein the edge of the floating gate is not lifted by the at least one spacer depositing step (c).

14. The method of claim 13 wherein the at least one spacer depositing step (c) further includes the step of:
    (c1) etching the at least one spacer.

15. The method of claim 14 wherein the first junction implanting step (b) further includes the step of:
    (b1) providing a phosphorus implant in the semiconductor.

16. The method of claim 15 wherein the second junction implant step further includes the step of:
    (d1) providing an arsenic implant in the semiconductor.

17. A method for providing a memory cell on a semiconductor comprising the steps of:
    (a) providing at least one gate stack on the semiconductor, the at least one gate stack having an edge;
    (b) providing at least one source implant in the semiconductor;
    (c) depositing at least one spacer after the at least one source implant is provided, a portion of the spacer being disposed along the edge of the at least one gate, the at least one spacer having a thickness of less than or equal to two hundred Angstroms; and
    (d) providing at least one drain implant in the semiconductor after the spacer is deposited.

18. The method of claim 17 wherein steps (a) through (d) are provided in sequential order.

19. The method of claim 17 wherein the portion of the at least one spacer includes a surface, substantially all of the surface being in contact with the edge of the at least one gate stack.

20. The method of claim 17 wherein the at least one gate stack includes at least one corner, the method further comprising the step of;
    (e) oxidizing the at least one gate stack in order to round the at least one corner.

21. The method of claim 20 wherein the at least one gate stack includes a floating gate having an edge; and wherein the edge of the floating gate is not lifted by the at least one spacer depositing step (c).

22. The method of claim 21 wherein the at least one spacer depositing step (c) further includes the step of:

(c1) etching the spacer.

23. A method for providing a memory on a semiconductor, the memory including a plurality of memory cells and at least one logic device, the method comprising the steps of:

(a) providing a plurality of gate stacks on the semiconductor for the plurality of memory cells, each of the plurality of gate stacks having an edge; and (b) depositing a spacer corresponding to each of the plurality of memory cells and to the at least one logic device in a single deposition step, a portion of the spacer corresponding to each of the plurality of memory cells being disposed along each of the plurality of gate stacks, the at least one spacer having a thickness of less than or equal to two hundred Angstroms.

24. The method of claim 23 wherein the portion of the at least one spacer includes a surface, substantially all of the surface being in contact with the edge of the at least one gate stack.

25. A method for providing a memory cell on a semiconductor comprising the sequential steps of:

(a) providing at least one gate stack on the semiconductor, the at least one gate stack having an edge, the at least one gate stack further including a floating gate having a corner;

(b) depositing at least one spacer, a portion of the at least one spacer being disposed along the edge of the at least one gate stack, the portion of the at least one spacer including a surface, substantially all of the surface being in contact with the edge of the at least one gate stack; and (c) providing at least one source implant in the semiconductor.

* * * * *